(12) United States Patent
Maki et al.

US009938606B2

(10) Patent No.: US 9,938,606 B2
(45) Date of Patent: Apr. 10, 2018

(54) HOT-ROLLED COPPER PLATE

(71) Applicant: MITSUBISHI MATERIALS CORPORATION, Tokyo (JP)

(72) Inventors: Kazunari Maki, Saitama (JP); Hiroyuki Mori, Tsukuba (JP); Isao Arai, Naka-gun (JP); Norihisa Iida, Osaka (JP); Takahiro Takeda, Kawanishi (JP); Shigeru Shimoizumi, Nishinomiya (JP); Shin Oikawa, Ageo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 241 days.

(21) Appl. No.: 14/782,177

(22) PCT Filed: Apr. 8, 2014

(86) PCT No.: PCT/JP2014/060151
§ 371 (c)(1),
(2) Date: Oct. 2, 2015

(87) PCT Pub. No.: WO2014/168132
PCT Pub. Date: Oct. 16, 2014

(65) Prior Publication Data
US 2016/0047017 A1 Feb. 18, 2016

(30) Foreign Application Priority Data
Apr. 8, 2013 (JP) .................................. 2013-080844

(51) Int. Cl.
| C22C 9/00 | (2006.01) |
| C22F 1/00 | (2006.01) |
| C22F 1/08 | (2006.01) |
| H01B 1/02 | (2006.01) |
| C23C 14/34 | (2006.01) |

(52) U.S. Cl.
CPC ............... *C22C 9/00* (2013.01); *C22F 1/00* (2013.01); *C22F 1/08* (2013.01); *C23C 14/3414* (2013.01); *H01B 1/026* (2013.01)

(58) Field of Classification Search
CPC ..... C22C 9/00; C22F 1/00; C22F 1/08; H01B 1/026
See application file for complete search history.

(56) References Cited

U.S. PATENT DOCUMENTS

| 2010/0307642 | A1* | 12/2010 | Palumbo ................. | C25D 3/38 148/518 |
| 2011/0123389 | A1* | 5/2011 | Shindo ................. | C22C 9/00 420/499 |
| 2011/0163447 | A1* | 7/2011 | Fukushima ............. | C22C 9/00 257/741 |
| 2012/0328468 | A1* | 12/2012 | Kumagai ............. | C23C 14/165 420/469 |
| 2013/0075272 | A1* | 3/2013 | Nakaya ................. | C22F 1/00 205/292 |

FOREIGN PATENT DOCUMENTS

| CN | 1389597 A | 1/2003 | |
| CN | 102652182 A | 8/2012 | |
| CN | 102712986 A | 10/2012 | |
| JP | 10-330923 A | 12/1998 | |
| JP | 11-158614 A | 6/1999 | |
| JP | 2009-114539 A | 5/2009 | |
| JP | 2011-132557 A | 7/2011 | |
| JP | 2011-162835 A | 8/2011 | |
| JP | 2012-062499 A | 3/2012 | |
| JP | 2014-051709 A | 3/2014 | |
| WO | WO-2011/099426 A | 8/2011 | |
| WO | WO 2011122493 A1 * | 10/2011 | ............. C22F 1/00 |

OTHER PUBLICATIONS

Office Action dated Aug. 4, 2016 for the corresponding Chinese Application No. 201480020010.X.
Kronberg et al., "Secondary Recrystallization in Copper", *Metal Transactions*, Aug. 1949, pp. 501-514, vol. 185.
Brandon "The Structure of High-Angle Grain Boundaries", *Acta Metallurgica*, Nov. 14, 1966, pp. 1479-1484, vol. 14.
Kita "Effects of Impurities on the Formation of Special Grain Boundaries of Pure Copper", *Journal of Japan Institute of Copper*, Aug. 1, 2012, pp. 42 -46, vol. 51, No. 1.
International Search Report dated Jul. 8, 2014 for the corresponding PCT Application No. PCT/JP2014/060151.
Office Action dated Dec. 9, 2014 for the corresponding Japanese Application No. 2013-080844.
Office Action dated Jan. 30, 2015 for the corresponding Taiwanese Application No. 103112851.

* cited by examiner

*Primary Examiner* — Jennifer A Smith
*Assistant Examiner* — Alexandra M Moore
(74) *Attorney, Agent, or Firm* — Leason Ellis LLP

(57) ABSTRACT

A hot-rolled copper plate consists of pure copper having a purity of 99.99 mass % or greater, the hot-rolled copper plate having an average crystal grain diameter of 40 μm or less, and a (Σ3+Σ9) grain boundary length ratio (L (σ3+σ9)/L), which is a ratio between a total crystal grain boundary length L measured by an EBSD method and a sum L (σ3+σ9) of a Σ3 grain boundary length Lσ3 and a Σ9 grain boundary length Lσ9, being 28% or greater.

7 Claims, No Drawings

HOT-ROLLED COPPER PLATE

CROSS-REFERENCE TO RELATED PATENT APPLICATIONS

This application is a U.S. National Phase Application under 35 U.S.C. § 371 of International Patent Application No. PCT/JP2014/060151, filed Apr. 8, 2014, and claims the benefit of Japanese Patent Application No. 2013-080844, filed Apr. 8, 2013, all of which are incorporated herein by reference in their entireties. The International Application was published in Japanese on Oct. 16, 2014 as International Publication No. WO/2014/168132 under PCT Article 21(2).

FIELD OF THE INVENTION

The present invention relates to a hot-rolled copper plate which is suitably used for a copper processed product such as a sputtering target, a baking plate, a Stevemold, an accelerator electronic tube, a magnetron, a superconducting stabilizer material, a heat dissipation substrate, a vacuum member, a tube plate of an heat exchanger, a bus bar, an electrode material, or an anode for plating.

BACKGROUND OF THE INVENTION

In the related art, in general, a copper plate consists of pure copper used in the above-described copper processed products is produced by a forging process of producing a pure copper ingot, a hot working process of performing hot working (hot rolling or hot forging) on the ingot, a cold working process of performing cold working (cold rolling or cold forging), and a heat treatment process of performing heat treatment for refining crystal grains or reducing distortion. In addition, the cold working process and the heat treatment process may be repeated as necessary.

By cutting the copper plate using a milling cutter, a drill, or the like or performing plastic working such as bending on the copper plate, a product having a desired shape is processed. Here, in the above-described copper plate, in order to prevent gouges and deformation during processing, it is necessary to refine crystal grain diameters and decrease residual distortion.

In addition, in recent years, the above-described copper plate is used as a sputtering target for a wring material of a semiconductor element. As the sputtering target, a copper plate having high purity in which impurity content is limited to decrease electric resistance of a wire on which a film is formed is used. In addition, in order to form a uniform sputtering film, a copper plate in which variations in crystal grain diameters and crystal orientation decrease is required.

In the related art, for example, in order to obtain the copper plate used in the sputtering target or the like, methods disclosed in PTLs 1 to 3 are suggested.

PTL 1 discloses a method for obtaining a sputtering target which has a substantially recrystallized structure, an average crystal grain diameter of 80 microns or less, and a Vickers hardness of 100 or less by performing hot working on a pure copper ingot having a purity of 99.995 wt % or greater, annealing the ingot, which has been subjected to the hot working, at a temperature of 900° C. or less, performing cold working on the annealed ingot at a rolling ratio of 40% or greater, and thereafter, performing recrystallization annealing on the ingot, which has been subjected to the cold working, at a temperature of 500° C. or less.

In addition, PTL 2 discloses a method for obtaining a sputtering target in which the content of copper in a state where gas components are removed is 99.999% or greater, an average particle diameter on a sputtering surface is 250 μm or less, variations in average particle diameters are within ±20%, an X-ray diffraction intensity ratio on I(111)/I(200) sputtering surface is 2.4 or greater, and variations in the X-ray diffraction intensity ratios are within ±20%, by performing hot working such as hot forging or hot rolling on a copper ingot having high purity of 6N or greater at a reduction ratio of 50% or greater, performing cold working such as cold rolling or cold forging on the ingot, which has been subjected to the hot working, at a reduction ratio of 30% or greater, and thereafter, performing heat treatment on the ingot, which has been subjected to the cold working, at 350° C. to 500° C. for 1 to 2 hours.

In addition, PTL 3 discloses a sputtering target which is obtained by removing a surface layer of an ingot formed of a copper having high purity of 6N or greater and additional elements, and thereafter, by performing hot forging, hot rolling, cold rolling, and heat treatment process on the ingot. Particularly, in an embodiment of PTL 3, it is described that a surface layer of a produced ingot is removed to form an ingot of φ160×60t, hot forging is performed at 400° C. to form an ingot of φ200, hot rolling is performed at 400° C. to form an ingot of φ270×20t, cold rolling is performed to form an ingot of φ360×10t, heat treatment is performed on the ingot at 500° C. for one hour, the entire target is cooled, and a target material is formed.

In a production method of a copper plate in the related art which is representative of a production method of a sputtering target, a crystal grain diameter, orientation of crystals, or the like is controlled by performing hot working (hot forging or hot rolling) on a pure copper ingot, and thereafter, performing cold working (cold forging and cold rolling) and heat treatment on the ingot which has been subjected to the hot working. In addition, since cold working conditions and heat treatment conditions greatly influence the crystal grain diameter, the orientation of crystals, or the like, in PTLs 1 to 3, the cold working conditions and the heat treatment conditions are defined.

CITATION LIST

Patent Literature

[PTL 1] Japanese Unexamined Patent Application, First Publication No. H11-158614
[PTL 2] Japanese Unexamined Patent Application, First Publication No. H10-330923
[PTL 3] Japanese Unexamined Patent Application, First Publication No. 2009-114539

Technical Problem

However, in the above-described copper plate (sputtering target) of the related art, it is necessary to perform cold working (cold forging and cold rolling) and heat treatment after hot working (hot forging and hot rolling) is performed on the pure copper ingot. Therefore, there is a problem in that the number of processes increases and production cost increases. In addition, since the cold working (cold forging and cold rolling) is performed, there is a disadvantage that it is not easy to decrease residual stress of the copper plate.

In addition, in the above-described copper plate, crystal grains are refined. However, like in a heat dissipation substrate, when stress is repeatedly applied to the heat dissipation substrate by a thermal cycle, fatigue characteristics are not sufficient. In addition, when the above-described copper plate is used for a supporting target, it is not possible to sufficiently prevent abnormal discharge at high-power sputtering.

The present invention is made in consideration of the above-described problems, and an object thereof is to provide a hot-rolled copper plate having improved workability and fatigue characteristics even when the hot-rolled copper plate is produced by hot rolling, and capable of sufficiently preventing abnormal discharge even when the hot-rolled copper plate is used as a sputtering target.

SUMMARY OF THE INVENTION

In order to solve the above-described problems, (1) according to an aspect of the present invention, there is provided a hot-rolled copper plate consisting of pure copper having a purity of 99.99 mass % or greater, the hot-rolled copper plate having an average crystal grain diameter of 40 µm or less, and a ($\Sigma3+\Sigma9$) grain boundary length ratio (L ($\sigma3+\sigma9$)/L), which is a ratio between a total crystal grain boundary length L measured by an EBSD method and a sum L ($\sigma3+\sigma9$) of a $\Sigma3$ grain boundary length L$\sigma3$ and a $\Sigma9$ grain boundary length L$\sigma9$, being 28% or greater.

In the hot-rolled copper plat, since the average crystal grain diameter is 40 µm or less, it is possible to prevent occurrence of gouges when cutting is performed. In addition, it is possible to improve workability when plastic working such as bending is performed.

In addition, in a sputtering target, since sputtering efficiency is different according to a crystal direction, irregularities occur for each crystal grain as sputtering proceeds, and abnormal discharge occurs. Here, in the hot-rolled copper plate of the present invention, since the average crystal grain diameter is 40 µm or less, irregularities decrease when sputtering is performed, and it is possible to prevent occurrence of abnormal discharge.

Moreover, the hot-rolled copper plate of the present invention is configured of pure copper having a purity of 99.99 mass %. Since impurities in the pure copper decrease the ($\Sigma3+\Sigma9$) grain boundary length ratio (L ($\sigma3+\sigma9$)/L), it is possible to allow the ($\Sigma3+\Sigma9$) grain boundary length ratio (L ($\sigma3+\sigma9$)/L) to be 28% or greater by allowing a purity of copper to be 99.99 mass % or greater. In addition, purity of copper is measured by a method defined according to JIS H 1051 (2005).

In addition, in the hot-rolled copper plate of the present invention, the ($\Sigma3+\Sigma9$) grain boundary length ratio (L ($\sigma3+\sigma9$)/L), which is a ratio between the total crystal grain boundary length L measured by an EBSD method and a sum L ($\sigma3+\sigma9$) of the $\Sigma3$ grain boundary length L$\sigma3$ and the $\Sigma9$ grain boundary length L$\Sigma9$, is 28% or greater, and many $\Sigma3$ grain boundaries and many $\Sigma9$ grain boundaries exist. In this way, when the ($\Sigma3+\Sigma9$) grain boundary length ratio (L ($\sigma3+\sigma9$)/L) is high, grain boundaries having high crystallinity (grain boundaries having decreased disturbance in an atomic arrangement) increase, differences between characteristics of crystal grain boundaries and characteristics inside crystal grains decrease, sputtering efficiency or the like is uniformized, and it is possible to prevent abnormal discharge. Moreover, when the ($\Sigma3+\Sigma9$) grain boundary length ratio (L ($\sigma3+\sigma9$)/L) is high, consistency of the crystal grain boundaries is improved, rupture does not easily occur even when transition is accumulated, and fatigue characteristics are remarkably improved. Particularly, when many $\Sigma9$ grain boundaries exist, since random grain boundaries are divided, it is possible to prevent influences of random grain boundaries.

In addition, the ($\Sigma3+\Sigma9$) grain boundary length ratio (L ($\sigma3+\sigma9$)/L) in the present invention is obtained by specifying crystal grain boundaries, $\Sigma3$ grain boundaries, and $\Sigma9$ grain boundaries by an EBSD measurement device using a field emission type scanning electron microscope, and calculating lengths of the grain boundaries.

The crystal grain boundary is defined as a boundary between crystals when an orientation direction difference between two adjacent crystals is 15° or greater as a result of the cross-sectional observation in two-dimension.

In addition, the $\Sigma3$ grain boundary and the $\Sigma9$ grain boundary are defined as crystal grain boundaries in which $\Sigma$ values defined based on a CSL theory (Kronberg et al: Trans. Met. Soc. AIME, 185, 501 (1949)) crystallographically are corresponding grain boundaries of 3 and 9, and an inherent corresponding portion lattice direction defect Dq in the corresponding grain boundary satisfies Dq≤15°/$\Sigma^{1/2}$ (D. G. Brandon: Acta. Metallurgica, Vol. 14, p. 1479 (1966)).

Meanwhile, the random grain boundary is a special grain boundary which has a corresponding direction relationship in which the $\Sigma$ value is 29 or less and satisfies Dq≤15°/$\Sigma^{1/2}$, that is, a grain boundary other than the above-described grain boundaries.

(2) According to another aspect of the present invention, in the hot-rolled copper plate described in (1), conductivity of the pure copper is 101% IACS or greater.

In addition, the conductivity is measured by a method defined according to JIS H 2123 (2009). Moreover, the IACS is an abbreviation for International Annealed Copper Standard.

As described above, impurities in the pure copper decrease the ($\Sigma3+\Sigma9$) grain boundary length ratio (L ($\sigma3+\sigma9$)/L). In addition, conductivity decreases as impurities in the pure copper increases. Accordingly, by defining the conductivity as described above, it is possible to decrease amounts of impurities in the pure copper, and it is possible to securely allow the ($\Sigma3+\Sigma9$) grain boundary length ratio (L ($\sigma3+\sigma9$)/L) to be 28% or greater.

As this pure copper, there is pure copper such as C10100 or Class 1 of American Standard ASTM F68.

(3) According to still another aspect of the present invention, in the hot-rolled copper plate described in (1) or (2), pure copper contains 0.0003 mass % or less of Fe, 0.0002 mass % or less of 0, 0.0005 mass % or less of S, and 0.0001 mass % or less of P with the balance being copper and inevitable impurities.

Particularly, since elements such as Fe, O, S, or P in impurities of the above-described pure copper decrease the ($\Sigma3+\Sigma9$) grain boundary length ratio (L ($\sigma3+\sigma9$)/L), by defining the content of each element as described above, it is possible to securely allow the ($\Sigma3+\Sigma9$) grain boundary length ratio (L ($\sigma3+\sigma9$)/L) to be 28% or greater.

(4) According to still another aspect of the present invention, in the hot-rolled copper plate described in any one of (1) to (3), Vickers hardness is 80 or less.

When the Vickers hardness is 80 or less, an amount of distortion in the hot-rolled copper plate decreases. Here, when a hot-rolled copper plate in which the amount of distortion decreases is used for a sputtering target, it possible to prevent occurrence of coarse clusters due to release of distortion during sputtering and occurrence of irregularities due to the coarse clusters, and it is possible to prevent occurrence of abnormal discharge.

(5) According to still another aspect of the present invention, in the hot-rolled copper plate described in any one of (1) to (4), preferably, the maximum value of strength of each plane direction of an inverse pole figure measured by the EBSD method is less than 5.

The strength of the inverse pole figure indicates that a plane direction frequently appears in a measurement plane many times with respect to a state where all crystal directions appear according to the same probability (structure of completely random orientation), and the plane direction is deviated to a specific crystal direction as the maximum value of the strength increases. That is, the maximum value of the strength in each plane direction of the inverse pole figure measured by the EBSD method being 5 or less means that crystal directions are random. In this way, since the crystal directions are random, sputtering efficiency is uniform, and it is possible to prevent abnormal discharge.

(6) According to still another aspect of the present invention, in the hot-rolled copper plate according to any one of (1) to (5), cold rolling having a rolling reduction ratio of 10% or less, or shape correction using a leveler is performed.

When cold rolling having a rolling reduction ratio of 10% or less, or shape correction using a leveler is performed, it is possible to prevent the (Σ3+Σ9) grain boundary length ratio (L (σ3+σ9)/L) from decreasing, and it is possible to prevent a preferred direction of rolling from being developed.

Advantageous Effects of Invention

According to the present invention, it is possible to provide a hot-rolled copper plate having improved workability and fatigue characteristics even when a hot-rolled copper plate is produced by hot rolling, and capable of sufficiently preventing abnormal discharge even when the hot-rolled copper is used for a sputtering target.

In addition, as described above, since the average crystal grain diameter is 40 μm or less and the (Σ3+Σ9) grain boundary length ratio (L (σ3+σ9)/L) is 28% or greater due to hot rolling, it is possible to omit a cold rolling process and a heat treatment process. Accordingly, it is possible to remarkably decrease a production cost of a copper processed product such as a sputtering target.

DETAILED DESCRIPTION OF THE INVENTION

Hereinafter, an embodiment of the present invention will be described.

A hot-rolled copper plate of the present embodiment consists of pure copper having a purity of 99.99 mass % or greater, and more specifically, the pure copper contains 0.0003 mass % or less of Fe, 0.0002 mass % or less of O, 0.0005 mass % or less of S, and 0.0001 mass % or less of P with the balance being copper and inevitable impurities.

In addition, in the hot-rolled copper plate of the present embodiment, an average crystal grain diameter is 40 μm or less, and Vickers hardness is 80 or less.

In addition, in the hot-rolled copper plate of the present embodiment, a (Σ3+Σ9) grain boundary length ratio (L (σ3+σ9)/L), which is a ratio between a total crystal grain boundary length L measured by an EBSD method and a sum L (σ3+σ9) of a Σ3 grain boundary length Lσ3 and a Σ9 grain boundary length Lσ9, is 28% or greater.

In addition, in the hot-rolled copper plate of the present embodiment, the maximum value of strength of each plane orientation of an inverse pole figure measured by the EBSD method is less than 5.

Here, the (Σ3+Σ9) grain boundary length ratio (L (σ3+σ9)/L) is obtained by specifying crystal grain boundaries, Σ3 grain boundaries, and Σ9 grain boundaries by an EBSD measurement device using a field emission type scanning electron microscope, and calculating lengths of the grain boundaries. That is, in the hot-rolled copper plate of the present embodiment, relatively many Σ3 grain boundaries and Σ9 grain boundaries exist.

The crystal grain boundary is defined as a boundary between crystals when an orientation direction difference between two adjacent crystals is 15° or greater as a result of the cross-sectional observation in two-dimension.

In addition, the Σ3 grain boundary and the Σ9 grain boundary are defined as crystal grain boundaries in which Σ values defined based on a CSL theory (Kronberg et al: Trans. Met. Soc. AIME, 185, 501 (1949)) crystallographically are corresponding grain boundaries of 3 and 9, and an inherent corresponding portion lattice direction defect Dq in the corresponding grain boundary satisfies $Dq \leq 15°/\Sigma^{1/2}$ (D. G. Brandon: Acta. Metallurgica, Vol. 14, p. 1479 (1966)).

Here, when the average crystal grain diameter exceeds 40 μm, since relatively coarse crystal grains exist, gouges occur during cutting. When a hot-rolled copper plate is used for a sputtering target, if gouges occur on a surface of the copper plate, discharging directions of sputter particles are not arranged due to minute irregularities, scatter deviation occurs, and particles in which steps of irregularities are starting points occur.

In addition, when crystal grain diameters are coarse, when plastic working such as bending is performed, there is a concern that working cracks may occur.

Accordingly, in the hot-rolled copper plate of the present embodiment, the average crystal grain diameter is defined so as to be 40 μm or less.

In addition, when the (Σ3+Σ9) grain boundary length ratio (L (σ3+σ9)/L), which is a ratio between the total crystal grain boundary length L measured by an EBSD method and a sum L (σ3+σ9) of the Σ3 grain boundary length Lσ3 and the Σ9 grain boundary length Lσ9, is less than 28%, consistency of crystal grain boundaries is not sufficient, and characteristics inside crystal grains and characteristics of the crystal grain boundaries are significantly different from each other. When a hot-rolled copper plate in which the (Σ3+Σ9) grain boundary length ratio (L (σ3+σ9)/L) is less than 28% is used for a sputtering target, irregularities occur along grain boundaries on the surface of the hot-rolled copper plate according to proceeding of sputtering, and abnormal discharge easily occurs. In addition, when the hot-rolled copper plate is used for a heat dissipation substrate, when transition is accumulated due to repeated loads, the hot-rolled copper plate is easily ruptured.

Accordingly, in the hot-rolled copper plate of the present embodiment, the (Σ3+Σ9) grain boundary length ratio (L (σ3+σ9)/L) is defined so as to be 28% or greater. In addition, in order to certainly achieve the above-described effects, preferably, the (Σ3+Σ9) grain boundary length ratio (L (σ3+σ9)/L) is 30% or greater, and more preferably, is 35% or greater.

The hot-rolled copper plate of the present embodiment is produced by performing hot rolling on a pure copper ingot and performing cold rolling of a rolling reduction ratio 10% or less or shape correction using a leveler in order to adjust a shape if necessary on the hot-rolled pure copper ingot.

That is, by performing only a hot rolling process without performing cold rolling and a heat treatment process, a crystal structure is controlled so that the average crystal grain diameter is 40 μm or less, and the (Σ3+Σ9) grain boundary length ratio (L (σ3+σ9)/L), which is the ratio between the total crystal grain boundary length L and the sum L (σ3+σ9) of the σ3 grain boundary length Lσ3 and the Σ9 grain boundary length Lσ9, is 28% or greater.

Hereinafter, a method for producing the hot-rolled copper plate of the present embodiment will be specifically described.

First, for example, copper having a purity of 99.99 mass % or greater is melted by a heating furnace, and a pure copper ingot is manufactured using a continuous casting machine. In this case, as impurities of the pure copper ingot, preferably, it is managed so that Fe is 0.0003 mass % or less, O is 0.0002 mass % or less, S is 0.0005 mass % or less, and P is 0.0001 mass % or less. The impurities can be managed by adjusting impurities mainly included in raw materials.

The pure copper ingot is heated. Preferably, a heating temperature is 550° C. to 950° C. The heated pure copper ingot is travelled between rolling rolls a plurality of times. Therefore, the heated pure copper ingot is rolled to a predetermined thickness. In this hot rolling, finish hot rolling is performed at a final step. Preferably, a temperature after the finish hot rolling ends is set to 600° C. or less. The finish hot rolling can be performed once or a plurality of times. Thereafter, preferably, the pure copper ingot is rapidly cooled at a cooling speed 200° C./min or greater from a temperature when the finish hot rolling ends to a temperature of 200° C. or less.

In addition, preferably, a total rolling ratio of the hot rolling and the finish hot rolling is 85% or greater.

Moreover, after the finish hot rolling is performed, in order to adjust a shape of the hot-rolled copper plate, cold rolling in which a rolling reduction ratio is 10% or less or a shape correction using a leveler may be performed.

According to the hot-rolled copper plate of the present embodiment having the above-described configuration, since the average crystal grain diameter is 40 μm or less, it is possible to prevent occurrence of gouges during the cutting. In addition, workability is improved during plastic working such as bending.

In addition, when the hot-rolled copper plate is used for a sputtering target, even though irregularities occurs for each crystal grain as sputtering proceeds, since the average crystal grain diameter is 40 μm or less, irregularities are minute during sputtering, and it is possible to prevent occurrence of abnormal discharge.

In addition, since the (Σ3+Σ9) grain boundary length ratio (L (σ3+σ9)/L), which is a ratio between the total crystal grain boundary length L and the sum L (σ3+σ9) of the Σ3 grain boundary length Lσ3 and the Σ9 grain boundary length Lσ9, is 28% or greater, grain boundaries having high crystallinity (grain boundaries in which disturbance of an atomic arrangement decreases) increase. Therefore, consistency of crystal grain boundaries is improved. Accordingly, rupture does not easily occur even when transition is accumulated, and fatigue characteristics are remarkably improved. In addition, differences between characteristics of crystal grain boundaries and characteristics inside crystal grains decrease, and when the hot-rolled copper plate is used for a sputtering target, minute irregularities do not easily occur on the surface of the hot-rolled copper plate as sputtering proceeds. Therefore, it is possible to prevent occurrence of abnormal discharge.

Moreover, in the hot-rolled copper plate of the present embodiment, by performing only a hot rolling process without performing cold rolling and a heat treatment process, since a crystal structure is controlled so that average crystal grain diameter is 40 μm or less, and the (Σ3+Σ9) grain boundary length ratio (L (σ3+σ9)/L), which is the ratio between the total crystal grain boundary length L and the sum L (σ3+σ9) of the Σ3 grain boundary length Lσ3 and the Σ9 grain boundary length Lσ9, is 28% or greater, it is possible to remarkably decrease a production cost of a copper produced product (sputtering target, heat dissipation substrate, or the like) which has the hot-rolled copper plate as a material.

In addition, in order to adjust the shape of the hot-rolled copper plate, cold rolling in which a rolling reduction ratio is 10% or less or shape correction using a leveler may be performed. In this case, since the rolling ratio is low, it is possible to prevent rolling from being developed in a preferred direction without decreasing the (Σ3+Σ9) grain boundary length ratio (L (σ3+σ9)/L).

In addition, since the hot-rolled copper plate of the present embodiment contains 0.0003 mass % or less of Fe, 0.0002 mass % or less of O, 0.0005 mass % or less of S, and 0.0001 mass % or less of P with the balance being copper and inevitable impurities, it is possible to prevent the (Σ3+Σ9) grain boundary length ratio (L (σ3+σ9)/L) from decreasing, and it is possible to certainly allow the (Σ3+Σ9) grain boundary length ratio (L (σ3+σ9)/L) to be 28% or greater.

Moreover, in the hot-rolled copper plate of the present embodiment, Vickers hardness is 80% or less and an amount of distortion in the hot-rolled copper plate decreases. Accordingly, when the hot-rolled copper plate is used for a sputtering target, it possible to prevent occurrence of coarse clusters due to release of distortion during sputtering and occurrence of irregularities due to the coarse clusters, and it is possible to prevent occurrence of abnormal discharge.

In addition, in the hot-rolled copper plate of the present embodiment, since the maximum value of strength of each plane orientation of the inverse pole figure measured by the EBSD method is defined so as to be less than 5, crystal directions are random without being deviated in a specific direction.

In this way, since the crystal directions are random, the crystal structure of the hot-rolled copper plate is uniformized, and when the hot-rolled copper plate is used for a sputtering target, it is possible to prevent abnormal discharge during sputtering.

In addition, in a method for producing the hot-rolled copper plate of the present embodiment, since the finishing hot rolling is performed on the hot-rolled copper plate at a relatively low temperature, the crystal grains are refined, and it is possible to increase the (Σ3+Σ9) grain boundary length ratio (L (σ3+σ9)/L) which is the ratio between the total crystal grain boundary length L and the sum of the Σ3 grain boundary length Lσ3 and the Σ9 grain boundary length Lσ9.

Accordingly, it is possible to produce the hot-rolled copper plate which consists of pure copper having a purity of 99.99 mass % or greater and the hot-rolled copper plate having the average crystal grain diameter of 40 μm or less, and the (Σ3+Σ9) grain boundary length ratio (L (σ3+σ9)/L), which is the ratio between the total crystal grain boundary length L measured by the EBSD method and the sum L (σ3+σ9) of the Σ3 grain boundary length Lσ3 and the Σ9 grain boundary length Lσ9, being 28% or greater.

Hereinbefore, the embodiment of the present invention will be described. However, the present invention is not limited to this, and may be appropriately modified within a scope which does not depart from technical ideas of the present invention.

For example, in the present embodiment, the case where the hot-rolled copper plate is used for a sputtering target or a heat dissipation substrate is described. However, the hot-rolled copper plate may be used for other copper processed products such as a baking plate, a Stevemold, an accelerator electronic tube, a magnetron, a superconducting stabilizer material, a vacuum member, a tube plate of a heat exchanger, a bus bar, an electrode material, and an anode for plating.

EXAMPLE

Hereinafter, a result of an evaluation test by which effects of the hot-rolled copper plate of the present invention are evaluated will be described.

Invention Examples 1 to 7

As a rolling material, a cast ingot of oxygen-free copper (having a purity of 99.99 mass % or greater) for an electron tube was used. Material size before rolling was performed was 620 mm in width×900 mm in length×250 mm in thickness, hot rolling was performed, and hot-rolled copper plates as described in Table 1 was manufactured. The total rolling ratio of the hot rolling process was set to 92%. In addition, in the finish hot rolling which is the rolling at the final step of the hot rolling process, starting temperatures and end temperatures of the finish hot rolling are shown in Table 1. The temperature measurement was performed by measuring the surface temperature of the rolling plate using a radiation thermometer. In addition, after the hot rolling ended, the hot-rolled copper plate was cooled by water at a cooling speed of 200° C./min or greater until the temperature was 200° C. or less. In addition, in Invention Example 7, cold rolling for shape correction was performed according to conditions of Table 1.

Comparative Examples 1 to 4

In Comparative Examples 1, 2, and 4, as a rolling material, a cast ingot of oxygen-free copper (having a purity of 99.99 mass % or greater) for an electron tube was used. In Comparative Example 3, as a rolling material, a cast ingot of phosphorous deoxidation copper (having a purity of 99.95 mass % or greater) was used. Material size before rolling was performed were set to 620 mm in width×900 mm in length×250 mm in thickness, hot rolling was performed, and hot-rolled copper plates as described in Table 1 was manufactured. In addition, a temperature measurement with respect to the starting temperatures and the ending temperatures of the finish hot rolling was performed by measuring a surface temperature of a rolling plate using a radiation thermometer. In addition, after the hot rolling ended, the hot-rolled copper plate was cooled by water at a cooling speed of 200° C./min or greater until the temperature was 200° C. or less. In addition, in Comparative Example 4, cold rolling was performed according to conditions of Table 1.

In hot-rolled copper plates of Invention Examples 1 to 6 and Comparative Examples 1 to 4 obtained as described above, average crystal grain diameters, (Σ3+Σ9) grain boundary length ratios (L (σ3+σ9)/L), maximum values of plane direction strength of inverse pole figures, Vickers hardness, states of gouges during processing using a milling cutter, and frequency of abnormal discharge when the hot-rolled copper plates were used for sputtering targets were evaluated.

<Average Crystal Grain Diameter>

In a measurement of the average crystal grain diameter, a microstructure observation was performed on a rolling surface (ND surface) of a hot-rolled copper plate using an optical microscope, and the average crystal grain diameter was measured based on JIS H 0501: 1986 (cutting method).

<(Σ3+Σ9) Grain Boundary Length Ratio (L (σ3+σ9)/L)>

With respect to the obtained hot-rolled copper plate, the (Σ3+Σ9) grain boundary length ratio (L (σ3+σ9)/L) was calculated. With each sample, after mechanical polishing was performed on a vertical section (surface when viewed from a TD direction) of each sample along a rolling direction (RD direction) using waterproof abrasive papers or diamond abrasive grains, finish polishing was performed on each sample using colloidal silica solution.

Crystal grain boundaries, Σ3 grain boundaries, and Σ9 grain boundaries are specified by an EBSD measurement device (S4300-SEM manufactured by HITACI Co. Ltd. and OIM Data Collection manufactured by EDAX/TSL Co. Ltd.) and an analysis software (OIM Data Analysis ver. 5.2 manufactured by EDAX/TLS Co. Ltd.) to calculate the lengths of the boundaries, and analysis of the (Σ3+Σ9) grain boundary length ratio (L (σ3+σ9)/L) was performed.

First, each measurement point (pixel) within a measurement range on a sample surface was irradiated with electron beams using a scanning electron microscope, the sample surface was two-dimensionally scanned by the electron beams, and a portion between measured points in which a direction difference between adjacent measured points was 15° or greater was set to a crystal grain boundary according to a direction analysis by back scattered electron beam diffraction.

In addition, all grain boundary lengths L of the crystal grain boundaries within a measurement range were measured, positions of crystal grain boundaries in which the boundary surfaces of adjacent crystal grains configured the Σ3 grain boundaries and the Σ9 grain boundaries were determined, the Σ3 grain boundary lengths Lσ3 and the Σ9 grain boundary lengths Lσ9 were obtained, the length ratio L (σ3+σ9)/L between all crystal grain boundary lengths L of the measured crystal grain boundaries and the sum of the Σ3 grain boundaries and the Σ9 grain boundaries was obtained, and the obtained ratio was set to the (Σ3+Σ9) grain boundary length ratio (L (σ3+σ9)/L).

<Maximum Value of Plane Direction Strength of Inverse Pole Figure>

By using an EBSD measurement device (S4300-SEM manufactured by HITACI Co. Ltd. and OIM Data Collection manufactured by EDAX/TSL Co. Ltd.), a rectangular region of 8 mm$^2$ was measured by a step size 2 μm, and the rectangular region was positioned at 2 mm in the rolling direction and 4 mm in the rolling surface direction (ND direction) and had short sides overlapping with the rolling surface in a vertical cross-section (surface when viewed from TD direction) along a rolling direction (RD direction) of the hot-rolled copper plate. A measurement area was set to an area in which the number of measured crystal grains sufficiently exceeded 5,000 by which reliability statistically equivalent to XRD could be obtained. Moreover, the step size was determined based on grain diameters of each sample so that scanning of the EBSD was completed during an appropriate time. Measured data was analyzed by an analysis software (OIM Data Analysis ver. 5.2 manufactured by EDAX/TLS Co. Ltd.), and the maximum value in the strength of the inverse pole figure in the rolling surface direction (ND) was calculated. The calculation was performed using a spherical surface harmonic function method, a development order was set to 16, and a half value width was set to 5°. In addition, OIM was an abbreviation of Orientation Imaging Microscopy.

<Vickers Hardness>

Vickers hardness of the vertical section (surface viewed from TD direction) along the rolling direction (RD) was measured according to a method defined by JIS Z 2244.

<States of Gouges During Processing Using Milling Cutter>

Each sample was a flat plate of 100×2000 mm, cutting in a cutting depth of 0.1 mm and at a cutting speed of 5000 m/minute was performed on the surface of the flat plate using a bite having a cemented carbide cutting edge in a milling machine, and the number of gouge scratches having lengths of 100 μm or greater existing in a field of view of 500 μm of the cutting surface was evaluated.

<Abnormal Discharge Frequency>

An integral target including a baking plate portion was manufactured so that a diameter of a target portion from each sample was 152 mm and a thickness of the target portion was 6 mm, the target was attached to a sputtering device, and sputtering test was performed under conditions in which an ultimate vacuum pressure in a chamber was set to $1\times10^{-5}$ Pa or less, a sputtering gas pressure was set to 0.3 Pa using Ar as sputtering gas, and a direct current (DC) source was set to a sputtering output 2 kW. The sputtering was continuously performed for 2 hours. While the sputtering was performed, frequency of abnormal discharge occurring due to sputtering abnormality was counted using an arc counter included in a power source.

Production conditions are shown in Table 1 and evaluation results are shown in Table 2.

TABLE 1

| | Composition | | | | | Con-ductivity % IACS | Hot rolling (finish) | | | Cold rolling Rolling ratio % |
|---|---|---|---|---|---|---|---|---|---|---|
| | Cu Mass % | O Mass % | S Mass % | Fe Mass % | P Mass % | | Starting temperature ° C. | Ending temperature ° C. | Rolling condition Rolling ratio × number of passes | |
| Invention Example 1 | 99.99≤ | 0.00011 | 0.00027 | 0.00011 | 0.00007 | 101.9 | 543 | 527 | 35% × 3 | 0 |
| Invention Example 2 | 99.99≤ | 0.00008 | 0.00031 | 0.00015 | 0.00002 | 102.1 | 523 | 513 | 30% × 3 | 0 |
| Invention Example 3 | 99.99≤ | 0.00001 | 0.00025 | 0.00027 | 0.00008 | 102.2 | 375 | 364 | 25% × 3 | 0 |
| Invention Example 4 | 99.99≤ | 0.00004 | 0.00017 | 0.00006 | 0.00003 | 101.7 | 452 | 438 | 30% × 3 | 0 |
| Invention Example 5 | 99.99≤ | 0.00009 | 0.00024 | 0.00017 | 0.00006 | 101.5 | 517 | 501 | 30% × 4 | 0 |
| Invention Example 6 | 99.99≤ | 0.00006 | 0.00027 | 0.00019 | 0.00005 | 102.4 | 539 | 517 | 25% × 4 | 0 |
| Invention Example 7 | 99.99≤ | 0.00008 | 0.00022 | 0.00001 | 0.00008 | 102.0 | 458 | 425 | 30% × 3 | 8 |
| Comparative Example 1 | 99.99≤ | 0.00001 | 0.00039 | 0.00016 | 0.00001 | 101.7 | 621 | 602 | 30% × 3 | 0 |
| Comparative Example 2 | 99.99≤ | 0.00014 | 0.0021 | 0.00017 | 0.00007 | 101.5 | 486 | 458 | 30% × 3 | 0 |
| Comparative Example 3 | 99.95 | 0.005 | 0.0087 | 0.0031 | 0.030 | 87.0 | 515 | 483 | 30% × 3 | 0 |
| Comparative Example 4 | 99.99≤ | 0.00011 | 0.00017 | 0.00021 | 0.00008 | 102.4 | 497 | 474 | 30% × 3 | 25 |

TABLE 2

| | Characteristic evaluation of hot-rolled copper plate | | | | Cutting workability | Sputtering characteristics Abnormal |
|---|---|---|---|---|---|---|
| | Average crystal grain diameter μm | (Σ3 + Σ9) grain boundary length ratio % | Vickers hardness Hv | Inverse pole figure | Number of gouges Number | discharge frequency Times |
| Invention Example 1 | 38 | 41.6 | 51 | 1.2 | 0 | 3 |
| Invention Example 2 | 35 | 54.9 | 61 | 1.8 | 1 | 1 |
| Invention Example 3 | 23 | 34.1 | 63 | 2.7 | 0 | 3 |
| Invention Example 4 | 28 | 60.4 | 59 | 2.6 | 0 | 1 |
| Invention Example 5 | 34 | 49.6 | 56 | 1.8 | 0 | 2 |
| Invention Example 6 | 33 | 71.1 | 58 | 2.1 | 1 | 1 |
| Invention Example 7 | 31 | 29.1 | 78 | 4.4 | 1 | 4 |
| Comparative Example 1 | 91 | 48.0 | 50 | 2.3 | 5 | 10 |
| Comparative Example 2 | 32 | 24.0 | 54 | 3.7 | 0 | 15 |
| Comparative Example 3 | 31 | 19.9 | 69 | 4.1 | 1 | 37 |

TABLE 2-continued

| | Characteristic evaluation of hot-rolled copper plate | | | | Cutting workability | Sputtering characteristics Abnormal |
|---|---|---|---|---|---|---|
| | Average crystal grain diameter μm | (Σ3 + Σ9) grain boundary length ratio % | Vickers hardness Hv | Inverse pole figure | Number of gouges Number | discharge frequency Times |
| Comparative Example 4 | 37 | 21.4 | 97 | 8.4 | 1 | 27 |

In Comparative Example 1, the average crystal was 91 μm, many gouges occurred, and the abnormal discharge frequency increased.

In Comparative Examples 2 and 3, the average grain diameters were 32 μm and 31 μm. However, the (Σ3+Σ9) grain boundary length ratios (L (σ3+σ9)/L) were low, for example, 24.0% and 19.9%. Accordingly, even when the gouges decreased, the abnormal discharge increased.

In Comparative Example 4, cold rolling was performed at a rolling ratio of 25% after the hot rolling was performed, and the average crystal grain diameter was 37 μm. However, the (Σ3+Σ9) grain boundary length ratio (L (σ3+σ9)/L) was low, for example, 21.4%. In addition, it was identified that the Vickers hardness was high, for example, 97 and residual distortion increased. Moreover, the maximum value of the plane direction strength of the inverse pole figure was 8.4, and it was identified that crystal directions were deviated in a constant direction by cold rolling of a rolling ratio of 25%. In Comparative Example 4, even when gouges decreased, the abnormal discharge frequency increased, for example, 27 times.

On the other hand, in Invention Examples 1 to 7 in which the average crystal grain diameters were 40 μm or less and the (Σ3+Σ9) grain boundary length ratios (L (σ3+σ9)/L) were 28% or greater, it was identified that gouges were hardly generated and the abnormal discharge frequency decreased.

In addition, in Invention Example 7, cold rolling of a rolling reduction ratio of 8% was performed after hot rolling. However, the (Σ3+Σ9) grain boundary length ratio (L (σ3+σ9)/L) was 29.1%, and the maximum value of the plane direction strength of the inverse pole figure was 4.4.

INDUSTRIAL APPLICABILITY

A hot-rolled copper plate of the present invention can be used for a material of a copper processed product such as a target, a baking plate, a Stevemold, an accelerator electronic tube, a magnetron, a superconducting stabilizer material, a heat dissipation substrate, a vacuum member, a tube plate of a heat exchanger, a bus bar, an electrode material, or an anode for plating.

What is claimed is:

1. A hot-rolled copper plate comprising:
pure copper having a purity of 99.99 mass % or greater, wherein
the hot-rolled copper plate has an average crystal grain diameter of 40 μm or less,
the hot-rolled copper plate has a (Σ3+Σ9) grain boundary length ratio (L (σ3+σ9)/L) of 28% or greater, said (Σ3+Σ9) grain boundary length ratio (L (σ3+σ9)/L) being a ratio between a total crystal grain boundary length L based on an EBSD method and a sum L (σ3+σ9) of a Σ3 grain boundary length Lσ3 and a Σ9 grain boundary length Lσ9, and
a maximum value of strength of each plane direction of an inverse pole figure based on the EBSD method is less than 5.

2. The hot-rolled copper plate according to claim 1, wherein conductivity of the pure copper is 101% IACS or greater.

3. The hot-rolled copper plate according to claim 1, wherein the pure copper contains 0.0003 mass % or less of Fe, 0.0002 mass % or less of O, 0.0005 mass % or less of S, and 0.0001 mass % or less of P with the balance being copper and inevitable impurities.

4. The hot-rolled copper plate according to claim 1, wherein Vickers hardness is 80 or less.

5. The hot-rolled copper plate according to claim 1, wherein cold rolling having a rolling reduction ratio of 10% or less, or shape correction using a leveler is performed.

6. The hot-rolled copper plate according to claim 1, wherein the (Σ3+Σ9) grain boundary length ratio is 28% to 34.1%.

7. A sputtering target comprising:
a hot-rolled copper plate having pure copper, wherein
a purity of the pure copper is 99.99 mass % or greater,
the hot-rolled copper plate has an average crystal grain diameter of 40 μm or less,
the hot-rolled copper plate has a (Σ3+Σ9) grain boundary length ratio (L (σ3+σ9)/L) of 28% or greater, said (Σ3+Σ9) grain boundary length ratio (L (σ3+σ9)/L) being a ratio between a total crystal grain boundary length L based on an EBSD method and a sum L (σ3+σ9) of a Σ3 grain boundary length Lσ3 and a Σ9 grain boundary length Lσ9, and
a maximum value of strength of each plane direction of an inverse pole figure based on the EBSD method is less than 5.

* * * * *